United States Patent
Li et al.

(10) Patent No.: US 12,123,933 B2
(45) Date of Patent: Oct. 22, 2024

(54) SYSTEM AND METHOD FOR OSCILLATORY EDDY CURRENT CORRECTION FOR DIFFUSION-WEIGHTED ECHO-PLANAR IMAGING

(71) Applicant: GE Precision Healthcare LLC, Wauwatosa, WI (US)

(72) Inventors: Hua Li, Sussex, WI (US); Lei Gao, Beijing (CN); Gaohong Wu, New Berlin, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 120 days.

(21) Appl. No.: 18/079,147

(22) Filed: Dec. 12, 2022

(65) Prior Publication Data
US 2024/0192299 A1    Jun. 13, 2024

(51) Int. Cl.
*G01V 3/00*    (2006.01)
*G01R 33/48*    (2006.01)
*G01R 33/563*    (2006.01)
*G01R 33/565*    (2006.01)

(52) U.S. Cl.
CPC ... *G01R 33/56518* (2013.01); *G01R 33/4818* (2013.01); *G01R 33/56341* (2013.01)

(58) Field of Classification Search
CPC .............. G01R 33/3415; G01R 33/543; G01R 33/5659; G01R 33/36; A61B 5/055
USPC ........................................................ 324/309
See application file for complete search history.

(56) References Cited

U.S. PATENT DOCUMENTS

2006/0261808 A1* 11/2006 Huang ............. G01R 33/56341
324/307

FOREIGN PATENT DOCUMENTS

CN    110907872 A   *   3/2020    ............. A61B 5/055

OTHER PUBLICATIONS

Calamante et al., "Correction for Eddy Current Induced $B_0$ Shifts in Diffusion-Weighted Echo-Planar Imaging", Magnetic Resonance in Medicine, 1999, vol. 41, pp. 95-102, Wiley Publications.

* cited by examiner

*Primary Examiner* — Walter L Lindsay, Jr.
*Assistant Examiner* — Frederick Wenderoth
(74) *Attorney, Agent, or Firm* — Fletcher Yoder P.C.

(57) ABSTRACT

A method for correcting diffusion-weighted echo-planar imaging data (DW-EPI) includes obtaining a first reference scan with no diffusion gradients applied, a second reference scan with a diffusion gradient applied only along a frequency direction, a third reference scan with the diffusion gradient applied only along a phase direction, and a fourth reference scan with the diffusion gradient applied only along a slice direction acquired utilizing an MRI scanner, wherein the reference scans lack phase encoding. The method includes obtaining DW-EPI data acquired utilizing the MRI scanner, wherein the DW-EPI data includes phase errors due to oscillatory eddy currents causing time-varying $B_0$ shift. The method includes generating a phase correction factor based on the reference scans and correcting the phase errors due to the oscillatory eddy currents in the DW-EPI data independent of diffusion gradient direction utilizing the phase correction factor to generate corrected DW-EPI data.

17 Claims, 10 Drawing Sheets

SYSTEM AND METHOD FOR OSCILLATORY EDDY CURRENT CORRECTION FOR DIFFUSION-WEIGHTED ECHO-PLANAR IMAGING

BACKGROUND

The subject matter disclosed herein relates to medical imaging and, more particularly, to a system and method for oscillatory eddy current correction for diffusion-weighted echo planar imaging (EPI).

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

In MRI, eddy currents are un-wanted currents generated with gradient field changes. The eddy currents distort the ideal gradient waveforms and cause artifacts in MRI images. The eddy currents can be characterized by a number of exponential terms and oscillatory terms. Exponential terms are the dominant terms. But MRI scanner could also be significantly affected by oscillatory terms. When oscillatory eddy currents (oEC) are not fully compensated for, it gives rise to time-varying errors in $B_0$, which in turn causes blurring and ghosting in diffusion-weighted EPI images. Most eddy current correction techniques for diffusion-weighted EPI only consider exponential terms.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for correcting diffusion-weighted echo-planar imaging data is provided. The computer-implemented method includes obtaining, via a processor, a first reference scan with no diffusion gradients applied, a second reference scan with a diffusion gradient applied only along a frequency direction, a third reference scan with the diffusion gradient applied only along a phase direction, and a fourth reference scan with the diffusion gradient applied only along a slice direction acquired utilizing a magnetic resonance imaging (MRI) scanner, wherein the first, second, third, and fourth reference scans lack phase encoding. The computer-implemented method also includes obtaining, via the processor, diffusion-weighted echo-planar imaging data acquired utilizing the MRI scanner, wherein the diffusion-weighted echo-planar imaging data includes phase errors due to oscillatory eddy currents causing time-varying $B_0$ shift, wherein the first reference scan, the second reference scan, the third reference scan, the fourth reference scan, and the diffusion-weighted echo-planar imaging data are acquired of a subject during an imaging session. The computer-implemented method further includes generating, via the processor, a phase correction factor based on the first, second, third, and fourth reference scans. The computer-implemented method still further includes correcting, via the processor, the phase errors due to the oscillatory eddy currents in the diffusion-weighted echo-planar imaging data independent of diffusion gradient direction utilizing the phase correction factor to generate corrected diffusion-weighted echo planar imaging data.

In another embodiment, a system for correcting diffusion-weighted echo-planar imaging data is provided. The system includes a memory encoding processor-executable routines. The system also includes a processor configured to access the memory and to execute the processor-executable routines, wherein the routines, when executed by the processor, cause the processor to perform actions. The actions include obtaining a first reference scan with no diffusion gradients applied, a second reference scan with a diffusion gradient applied only along a frequency direction, a third reference scan with the diffusion gradient applied only along a phase direction, and a fourth reference scan with the diffusion gradient applied only along a slice direction acquired utilizing a magnetic resonance imaging (MRI) scanner, wherein the first, second, third, and fourth reference scans lack phase encoding. The actions also include obtaining diffusion-weighted echo-planar imaging data acquired utilizing the MRI scanner, wherein the diffusion-weighted echo-planar imaging data includes phase errors due to oscillatory eddy currents causing time-varying $B_0$ shift, wherein the first reference scan, the second reference scan, the third reference scan, the fourth reference scan, and the diffusion-weighted echo-planar imaging data are acquired of a subject during an imaging session. The actions further include generating, via the processor, a phase correction factor based on the first, second, third, and fourth reference scans. The actions still further include correcting the phase errors due to the oscillatory eddy currents in the diffusion-weighted echo-planar imaging data independent of diffusion gradient direction utilizing the phase correction factor to generate corrected diffusion-weighted echo planar imaging data.

In a further embodiment, a non-transitory computer-readable medium, the computer-readable medium including processor-executable code that when executed by a processor, causes the processor to perform actions. The actions include obtaining a first reference scan with no diffusion gradients applied, a second reference scan with a diffusion gradient applied only along a frequency direction, a third reference scan with the diffusion gradient applied only along a phase direction, and a fourth reference scan with the diffusion gradient applied only along a slice direction acquired utilizing a magnetic resonance imaging (MRI) scanner, wherein the first, second, third, and fourth reference scans lack phase encoding. The actions also include obtaining diffusion-weighted echo-planar imaging data acquired utilizing the MRI scanner, wherein the diffusion-weighted echo-planar imaging data includes phase errors due to oscillatory eddy currents causing time-varying $B_0$ shift, wherein the first reference scan, the second reference scan, the third reference scan, the fourth reference scan, and the diffusion-weighted echo-planar imaging data are acquired of a subject during an imaging session. The actions further include generating, via the processor, a phase correction factor based on the first, second, third, and fourth reference scans. The actions still further include correcting the phase errors due to the oscillatory eddy currents in the diffusion-weighted echo-planar imaging data independent of diffusion gradient direction utilizing the phase correction factor to generate corrected diffusion-weighted echo planar imaging data.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
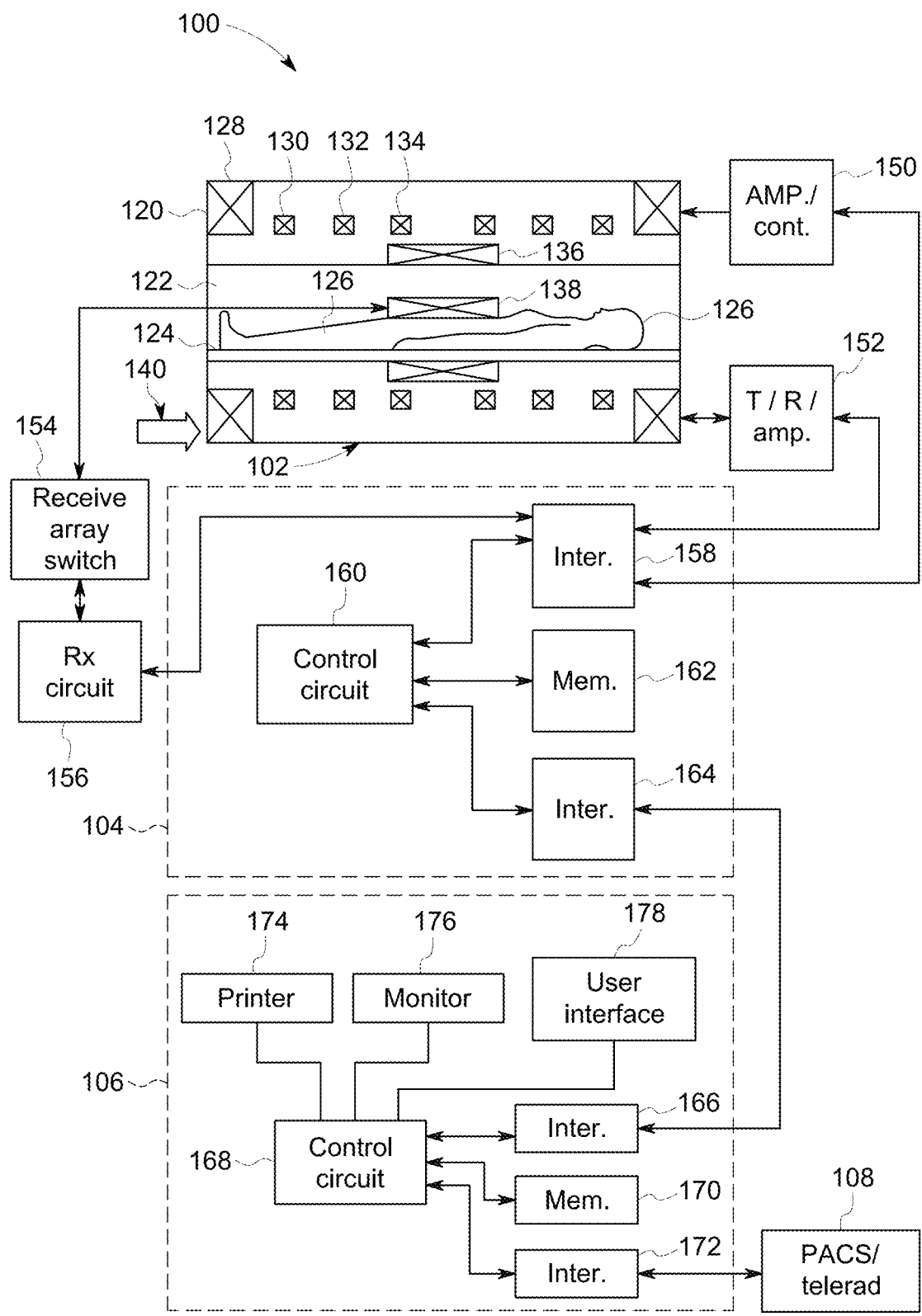
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The present disclosure provides systems and methods correcting diffusion-weighted echo-planar imaging data. In particular, the systems and methods are configured to correct $B_0$ shift caused by oscillatory eddy currents (both exponential and oscillatory eddy currents, but especially oscillatory eddy currents). In particular, phase errors due to oscillatory eddy currents causing time-varying $B_0$ shift are corrected. The disclosed embodiments include obtaining a first reference scan with no diffusion gradients applied, a second reference scan with a diffusion gradient applied only along a frequency direction, a third reference scan with the diffusion gradient applied only along a phase direction, and a fourth reference scan with the diffusion gradient applied only along a slice direction acquired utilizing a magnetic resonance imaging (MRI) scanner, wherein the first, second, third, and fourth reference scans lack phase encoding. The disclosed embodiments also include obtaining diffusion-weighted echo-planar imaging data acquired utilizing the MRI scanner, wherein the diffusion-weighted echo-planar imaging data includes phase errors due to oscillatory eddy currents causing time-varying $B_0$ shift, wherein the first reference scan, the second reference scan, the third reference scan, the fourth reference scan, and the diffusion-weighted echo-planar imaging data are acquired of a subject during an imaging session. The disclosed embodiments further include generating, via the processor, a phase correction factor based on the first, second, third, and fourth reference scans. The disclosed embodiments still further include correcting the phase errors due to the oscillatory eddy currents in the diffusion-weighted echo-planar imaging data independent of diffusion gradient direction utilizing the phase correction factor to generate corrected diffusion-weighted echo planar imaging data.

In certain embodiments, generating the phase correction factor includes calculating a first phase difference along the frequency direction, a second phase difference along the phase direction, and a third phase difference along the slice direction, and utilizing the first, second, and third phase differences in generating the phase correction factor. In certain embodiments, the first, second, and third phase differences are respectively acquired at a respective central readout point for each ky line. In certain embodiments, the first, second, and third phase differences are respectively acquired at an average of multiple readout points for each ky line. In certain embodiments, the first, second, and third phase differences are acquired utilizing other readout points for each ky line (as long as there is adequate signal). In certain embodiments, the respective diffusion gradient amplitudes in the reference scans (e.g., second, third, and fourth reference scans) are selected to keep calculated b-values between 50 and 100 seconds/millimeter$^2$ (s/mm$^2$). The first phase difference is an oscillatory eddy current-induced phase change due to the diffusion gradient applied along the frequency direction, and the phase correction factor is only a function of ky (i.e., independent of x and kx). The reference scans (e.g., second, third, and fourth reference scans) and the actual scan (e.g., a diagnostic scan to acquire the diffusion-weighted echo planar imaging data) have the same diffusion gradient duration (when applied), same separation, and same ramp time. In certain embodiments, generating the phase correction factor includes scaling the first phase by a quotient of a first amplitude of the diffusion gradient applied in the frequency direction when acquiring the diffusion-weighted echo-planar imaging data divided by a second amplitude of the diffusion gradient applied in the frequency direction in acquiring the second reference scan. The scaling enables the phase correction factor to be applied to any diffusion gradient direction and all diffusion gradient directions. The correction of the phase errors may be applied in either k-space or hybrid x-ky space (e.g., with one-dimensional (1D) Fast Fourier transformation (FFT) along the kx direction). Correction of $B_0$ shift (i.e., phase errors) due to the oscillatory eddy currents enables the generation of a diffusion-weighted echo-planar image from the corrected diffusion-weighted echo planar imaging data free of ghosting and blurring errors or with minimal ghosting and blurring errors. This correction is also different from compensation (e.g., product compensation). It should be noted that exponential eddy currents cause a relatively constant $B_0$ shift during the echo-planar imaging readout window, which only causes an imaging shift along the phase encoding direction.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_0$. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, the memory circuit 170 may store one or more neural networks for reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
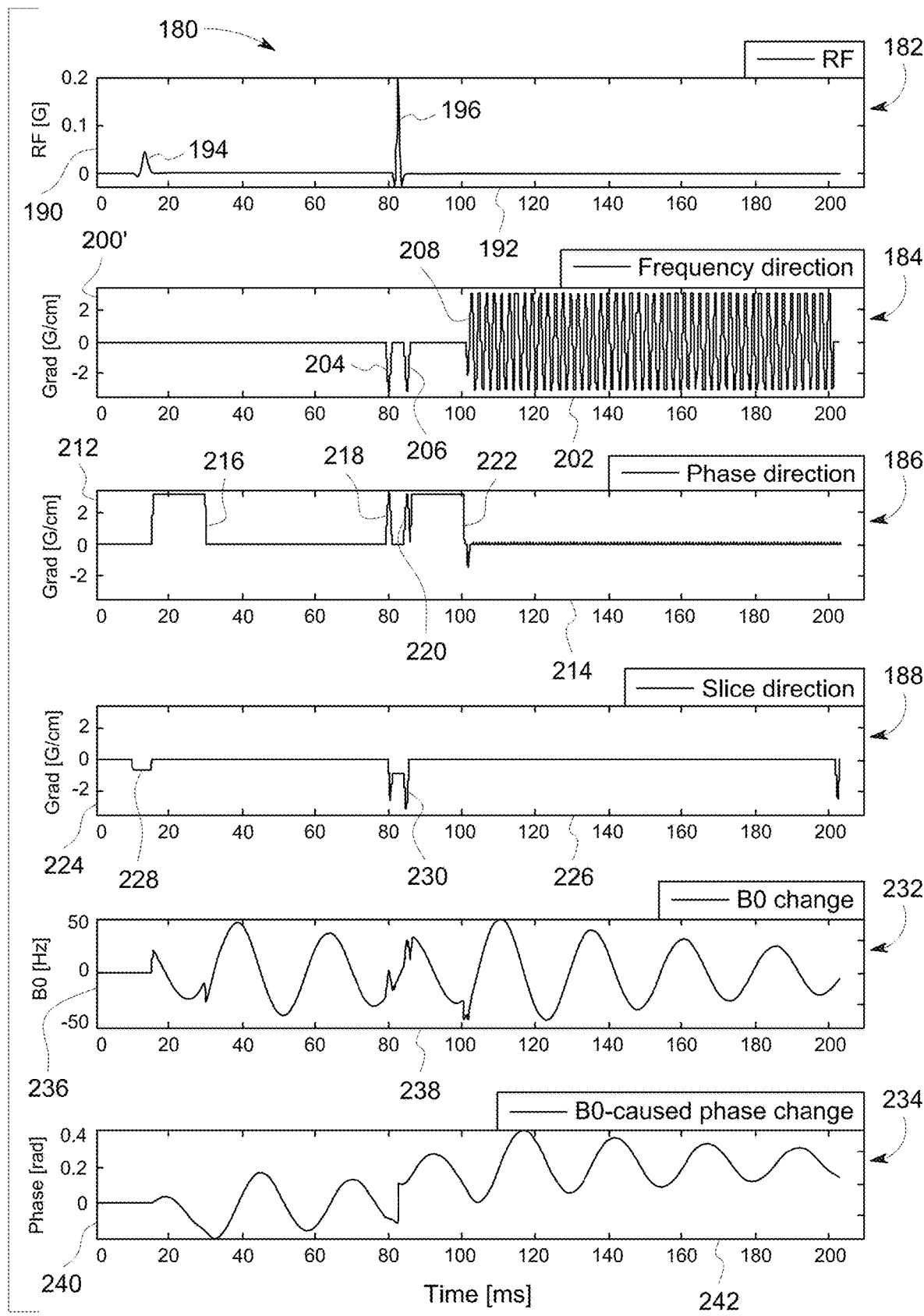
FIG. 2 illustrates a pulse sequence diagram for a diffusion-weighted echo-planer imaging scan having simulated $B_0$ variation due to an oscillatory eddy current term.

FIG. 2 illustrates a pulse sequence diagram 180 for a diffusion-weighted echo-planer imaging having simulated $B_0$ variation due to an oscillatory eddy current term. The first four (i.e., top) rows 182, 184, 186, 188 of the pulse sequence diagram 180 illustrate a typical diffusion-weighted echo-plane imaging sequence with the diffusion gradient along the phase direction. A first row 182 of the pulse sequence diagram 180 illustrates RF (represented along Y-axis 190) over time (represented along X-axis 192). As depicted, RF pulses 194, 196 are generated at approximately 15 and 90 milliseconds. A second row 184 of the pulse sequence diagram 180 illustrates a gradient (represented along Y-axis 200) applied along a frequency direction over time (represented along X-axis 202). The crusher gradient along the frequency direction is applied just prior to (as represented by reference numeral 204) and just after (as represented by reference numeral 206) the RF pulse 196. Then, readout gradient along the frequency direction is applied in an oscillating manner (represented by reference numeral 208) between 100 and 200 milliseconds. A third row 186 of the pulse sequence diagram 180 illustrates a gradient (represented along Y-axis 212) applied along a phase direction over time (represented along X-axis 214). The diffusion gradient is applied along the phase direction right after the RF pulse 194 as represented by reference numeral 216. The crusher gradient is applied along the phase direction just prior to (as represented by reference numeral 218) and just after (as represented by reference numeral 220) the RF pulse 196. Then the diffusion gradient is applied again immediately after as represented by reference numeral 222. The fourth row 188 of the pulse sequence diagram 180 illustrates a gradient (represented along the Y-axis 224) applied along a slice direction over time (represented along the X-axis 226). The slice-selective gradient is applied along the slice direction at about the same time as the RF pulse 194 as represented by reference numeral 228. The slice-selective gradient is also applied along the slice direction at about the same time as the RF pulse 196 as represented by reference numeral 230.

The pulse sequence diagram also includes a fifth row 232 and a sixth row 234. The fifth row 232 illustrates simulated $B_0$ variation due to a Y-$B_0$ oscillatory eddy current term. In particular, the $B_0$ variation is caused by the Y gradient. The oscillatory eddy current term has an amplitude of 0.2 percent, a time-constant of 100 milliseconds, an oscillation frequency of 40 Hz, and an initial phase of 40 degrees. The fifth row 232 illustrates $B_0$ (represented along the Y-axis 236) over time (represented along the X-axis 238). The oscillating $B_0$ change causes a phase change as depicted in the sixth row 234. In particular, there is an extra phase for each ky line. The sixth row 234 illustrates phase (represented along the Y-axis 240) over time (represented along the X-axis 242). Without removing the extra phase, ghosting and blurring artifacts would occur in the diffusion weighted echo-planar image. The techniques described remove this extras phase change caused by the diffusion gradient (i.e., the diffusion gradient applied along the phase direction).

Figure 3:
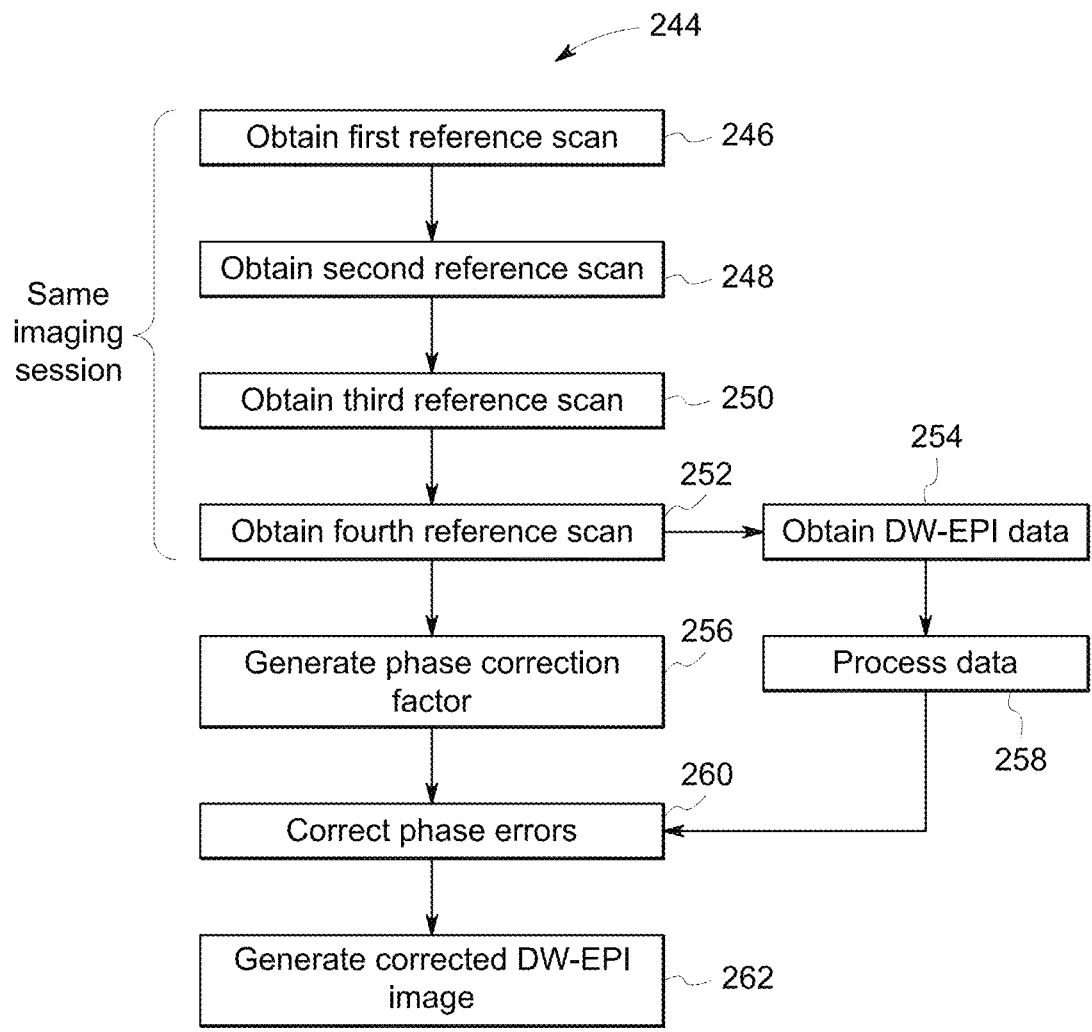
FIG. 3 illustrates a flow chart of a method for correcting diffusion-weighted echo-planar imaging data, in accordance with aspects of the present disclosure.

FIG. 3 illustrates a flow chart of a method 244 for correcting diffusion-weighted echo-planar imaging data. One or more steps of the method 244 may be performed by processing circuitry of the magnetic resonance imaging system 100 in FIG. 1 or a remote computing system. One or more of the steps of the method 244 may be performed simultaneously or in a different order from the order depicted in FIG. 3.

The method 244 includes obtaining a first reference scan with no diffusion gradients applied acquired utilizing an MRI scanner (e.g., MRI scanner 102 in FIG. 1), wherein the first reference scan lacks phase encoding (block 246). The method 244 also includes obtaining a second reference scan with a diffusion gradient applied only along a frequency direction acquired utilizing the MRI scanner, wherein the second reference scan lacks phase encoding (block 248). The method 244 further includes obtaining a third reference scan with the diffusion gradient applied only along a phase direction acquired utilizing the MRI scanner, wherein the third reference scan lacks phase encoding (block 250). The method 244 still further includes obtaining a fourth reference scan with the diffusion gradient applied only along the slice direction acquired utilizing the MRI scanner, wherein the fourth reference scan lacks phase encoding (block 252). The respective amplitudes of the gradient amplitudes in the reference scans (i.e., the second, third, and fourth reference scans) cannot be too strong. Otherwise, there may be extra motion-induced phase change in the second, third, and fourth references scans. The respective gradient amplitudes in the reference scans (i.e., the second, third, and fourth reference scans) also cannot be too small. Otherwise, the sensitivity to the oscillatory eddy current-induced phase change may be too low. The respective amplitudes of the diffusion gradient applied in the frequency direction when acquiring the second reference scan, the diffusion gradient applied in the phase direction when acquiring the third reference scan, and the diffusion gradient applied in the slice direction when acquiring the fourth reference scan are selected to keep calculated b-values between approximately 50 and 100 s/mm$^2$.

In certain embodiments, the first, second, third, and fourth reference scans are acquired for each respective slice and utilized in phase correction (i.e., oscillatory eddy current correction (oECC)) in their respective slice. In particular, the first, second, third and fourth reference scans are utilized in the generation of a respective phase correction factor generated for each respective slice where the diffusion-weighted echo-planar imaging data is acquired, and phase errors are corrected with the respective phase correction factor for the diffusion-weighted echo-planer imaging data acquired at the respective slice. In certain embodiments, in order to save scan time, the first, second, third, and fourth reference scans are acquired for a particular slice (e.g., a first slice) and utilized in phase correction in that particular slice as well as other slices. In particular, the first, second, third, and fourth reference scans are generated for the first slice where the diffusion-weighted echo-planar imaging data is acquired, and the phase errors are corrected with the phase correction factor for the diffusion-weighted echo-planer imaging data acquired at the first slice and other slices. In certain embodiments, more than one set of reference scans (e.g., first, second, third, and fourth reference scans) may be acquired at different slices but be utilized in phase correction of their respective slices where acquired and other slices.

The method 244 also includes obtaining (as part of an actual scan such as a diagnostic scan) diffusion-weighted echo-planar imaging (DW-EPI) data acquired utilizing the MRI scanner (block 254). The diffusion-weighted echo-planar imaging data includes phase errors due to oscillatory eddy currents causing time-varying $B_0$ shift. The first reference scan, the second reference scan, the third reference scan, the fourth reference scan, and the diffusion-weighted echo-planar imaging data are acquired of a subject during an imaging session (i.e., the same imaging session or same scan or same imaging sequence).

The method 244 further includes generating a phase correction factor (or oECCPhase) based on the first, second, third, and fourth reference scans (block 256). During the generation of the phase correction factor, each of the first, second, third, and fourth reference scans is subjected to row flip, ramp sampling interpolation, and 1D FFT. A signal or sample for each point (or location) along each ky line is obtained from the FFT. Generation of the phase correction factor also includes unwrapping the angle of each single or sample for each point along each ky line to derive a phase for that particular point.

Once the phase is obtained for each point, generating the phase correction factor includes calculating a first phase difference along the frequency direction, a second phase difference along the phase direction, and a third phase difference along the slice direction, and utilizing the first, second, and third phase differences in generating the phase correction factor. The first, second, and third phase differences are calculated for each ky line. In certain embodiments, the first, second, and third phase differences are respectively acquired at a respective central readout point for each ky line. In certain embodiments, the first, second, and third phase differences are respectively acquired at an average of multiple readout points for each ky line. In certain embodiments, the first, second, and third phase differences are acquired utilizing other readout points for each ky line (as long as there is adequate signal). The first phase difference is based on the difference between corresponding points derived from the second reference scan and the first reference scan. The second phase difference is based on the difference between corresponding points derived from the third reference scan and the first reference scan. The third phase difference is based on the difference between corresponding points derived from the third reference scan and the first reference scan. The first, second, and third phase differences are then subjected to unwrapping.

The first phase difference is an oscillatory eddy current-induced phase change due to the diffusion gradient applied along the frequency direction. Since the diffusion gradient amplitude of the actual scan (where DW-EPI data is acquired) is different from the diffusion gradient amplitude in the second reference scan, the first phase difference (upon being unwrapped) is scaled by a quotient of an amplitude of the diffusion gradient applied in the frequency direction in acquiring the diffusion-weighted echo-planar imaging data (i.e., the actual scan) divided by an amplitude of the diffusion gradient applied in the frequency direction in acquiring the second reference scan. The second phase difference (upon being unwrapped) is scaled by a quotient of an amplitude of the diffusion gradient applied in the phase direction in acquiring the diffusion-weighted echo-planar imaging data (i.e., the actual scan) divided by an amplitude of the diffusion gradient applied in the phase direction in acquiring the third reference scan. The third phase difference (upon being unwrapped) is scaled by a quotient of an amplitude of the diffusion gradient applied in the slice direction in acquiring the diffusion-weighted echo-planar imaging data (i.e., the actual scan) divided by an amplitude of the diffusion gradient applied in the slice direction in acquiring the fourth reference scan. The reference scans have the same diffusion gradient duration, separation, and ramp time as the actual scan. Only the gradient amplitudes are different between the reference scans and the actual scan. The scaling enables the phase correction factor to be applied to any diffusion gradient direction and all diffusion gradient directions. The phase correction factor is a sum of each of the scaled (and unwrapped) first, second, and third phase differences. The phase correction factor is only a function of ky (i.e., independent of x and kx).

The method 244 still further includes processing the diffusion-weighted echo-planar imaging data acquired during the actual scan (e.g., diagnostic scan) (block 258). In particular, the diffusion-weighted echo-planar imaging data is subjected to row flip, phase correction in the readout direction, and ramp sampling interpolation as part of reconstructing an image from the diffusion-weighted echo-planar imaging data.

The method 244 even further includes correcting the phase errors due to the oscillatory eddy currents in the diffusion-weighted echo-planar imaging data (after processing) independent of diffusion gradient direction utilizing the phase correction factor to generate corrected diffusion-weighted echo planar imaging data (block 260). The correction of the phase errors may be applied in either k-space or hybrid x-ky space (e.g., with 1D FFT along the kx direction) since the phase correction factor is independent of x or kx.

The method 244 yet further includes generating a diffusion-weighted echo-planar (DW-EPI) image from the corrected diffusion-weighted echo planar imaging data (block 262). The DW-EPI image may be free of ghosting and blurring errors or have minimal ghosting and/or blurring errors.

Figure 4:
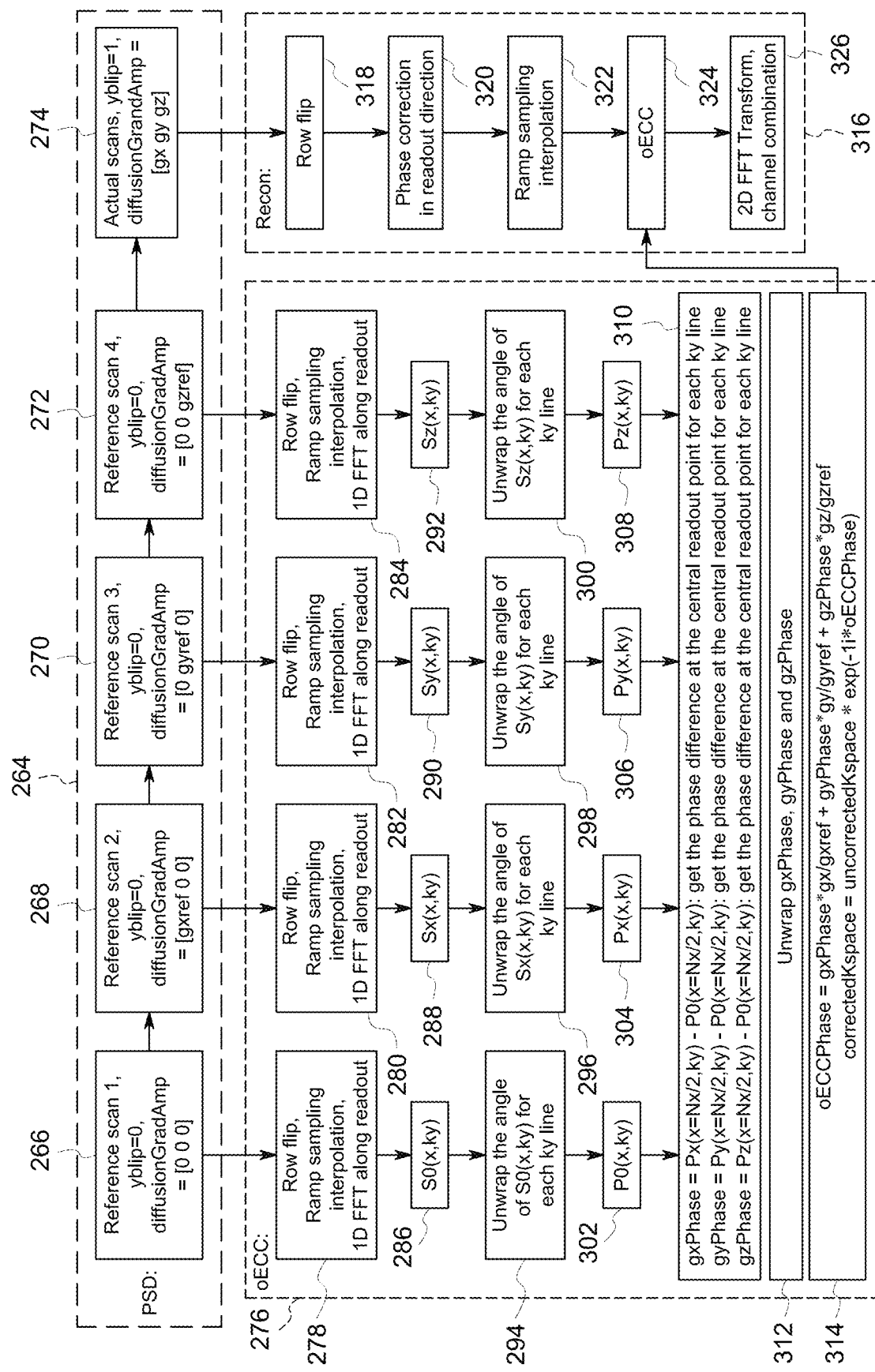
FIG. 4 illustrates a schematic diagram of the process for obtaining and correcting diffusion-weighted echo-planar imaging data, in accordance with aspects of the present disclosure.

FIG. 4 illustrates a schematic diagram of the process for obtaining and correcting diffusion-weighted echo-planar imaging data in more detail. One portion of the process is performing a pulse sequence diagram 264 for acquiring reference data and actual (e.g., diagnostic) diffusion-weighted echo planar imaging data. The pulse sequence diagram 264 includes acquiring a first reference scan 266 with no diffusion gradients applied utilizing an MRI scanner (e.g., MRI scanner 102 in FIG. 1), wherein the first reference scan 266 lacks phase encoding (i.e., the phase direction is set to 0 or yblip=0). The pulse sequence diagram 264 also includes acquiring a second reference scan 268 with a diffusion gradient applied only along a frequency direction (i.e., gxref) utilizing the MRI scanner, wherein the second reference scan 268 lacks phase encoding (i.e., the phase direction is set to 0 or yblip=0). The pulse sequence diagram 264 further includes acquiring a third reference scan 270 with the diffusion gradient applied only along a phase direction (i.e., gyref) utilizing the MRI scanner, wherein the third reference scan 270 lacks phase encoding (i.e., the phase direction is set to 0 or yblip=0). The pulse sequence diagram 264 still further includes acquiring a fourth reference scan 272 with the diffusion gradient applied only along the slice direction (i.e., gzref) utilizing the MRI scanner, wherein the fourth reference scan 272 lacks phase encoding (i.e., the phase direction is set to 0 or yblip=0). The respective amplitudes of the diffusion gradient applied in the frequency direction (i.e., gxref) when acquiring the second reference scan 268, the diffusion gradient (i.e., gyref) applied in the phase direction when acquiring the third reference scan 270, and the diffusion gradient applied in the slice direction (i.e., gzref) when acquiring the fourth reference scan 272 are selected to keep calculated b-values between approximately 50 and 100 s/mm$^2$.

The pulse sequence diagram 264 also includes acquiring (as part of an actual scan such as a diagnostic scan) diffusion-weighted echo-planar imaging (DW-EPI) data 274 utilizing the MRI scanner (block 254). Diffusion gradients are applied in both the frequency direction (i.e., gx), the phase direction (i.e., gy), and the slice direction (i.e., gz). The diffusion-weighted echo-planar imaging data includes phase errors due to oscillatory eddy currents causing time-varying $B_0$ shift. The first reference scan 266, the second reference scan 268, the third reference scan 270, the fourth reference scan 272, and the diffusion-weighted echo-planar imaging data 274 are acquired of a subject during an imaging session (i.e., the same imaging session or same scan or same imaging sequence).

Another portion of the process is generating a phase correction factor (oECCPhase) for correcting the oscillatory eddy current-induced phase errors in the diffusion-weighted echo-planar imaging data 274 as represented by reference numeral 276. To begin the process, each of the first, second, third, and fourth reference scans 266, 268, 270, and 272 is subjected to row flip, ramp sampling interpolation, and 1D FFT as represented by reference numeral 278, 280, 282, and 284, respectively. A signal or sample for each point (or location) along each ky line is obtained from the FFT derived from each of these scans 266, 268, 270, and 272 as represented by reference numerals 286, 288, 290, and 292, respectively. Samples or signals at each point are represented by S0(x, ky), Sx(x, ky), Sy(x, ky) and Sz(x, ky) for the respective reference scans 266, 268, 270, and 272. Unwrapping of the angle of each single or sample for each point along each ky line 286, 288, 290, and 292 for the respective reference scans 266, 268, 270, and 272 then occurs (as represented by reference numerals 294, 296, 298, and 300) to derive a phase for that particular point as represented by reference numerals 302, 304, 306, and 308. The phases for each point along each ky line for the respective reference scans 266, 268, 270, and 272 are represented by P0(x, ky), Px(x, ky), Py(x, ky), and Pz(x, ky), respectively.

The next step in generating the phase correction factor includes generating respective phase differences (as represented by reference numeral 310) along the frequency direction, the phase direction, and the slice direction as represented by gxPhase, gyPhase, and gzPhase. The gxPhase, gyPhase, and gzPhase are calculated for each ky line. As depicted, the gxPhase, gyPhase, and gzPhase are respectively acquired at a respective central readout point (Nx/2) for each ky line. In certain embodiments, the gxPhase, gyPhase, and gzPhase are respectively acquired at an average of multiple readout points for each ky line. In certain embodiments, the gxPhase, gyPhase, and gzPhase are acquired utilizing other readout points for each ky line (as long as there is adequate signal). The gxPhase is based on the difference between corresponding points (utilizing the central readout point as an example) derived from the second reference scan 268 (Px(Nx/2, ky)) and the first reference scan 266 (P0(Nx/2, ky)). The gyPhase is based on the difference between corresponding points (utilizing the central readout point as an example) derived from the third reference scan 270 (Py(Nx/2, ky)) the first reference scan 266 (P0(Nx/2, ky)). The gzPhase difference is based on the difference between corresponding points (utilizing the central readout point as an example) derived from the fourth reference scan 272 (Pz(Nx/2, ky)) and the first reference scan 266 (P0(Nx/2, ky)). The gxPhase, gyPhase, and gzPhase are then subjected to unwrapping (as indicated by reference numeral 312).

The gxPhase is an oscillatory eddy current-induced phase change due to the diffusion gradient applied along the frequency direction. Since the diffusion gradient amplitude (gx) of the actual scan 274 is different from the diffusion gradient amplitude (gxref) in the second reference scan 268, the gxPhase (upon being unwrapped) is scaled by gx/gxref. The gyPhase (upon being unwrapped) is scaled by gy/gyref, where gy is an amplitude of the diffusion gradient applied in the phase direction in acquiring the diffusion-weighted echo-planar imaging data (i.e., the actual scan 274) and gyref is an amplitude of the diffusion gradient applied in the phase direction in acquiring the third reference scan 270. The gzPhase (upon being unwrapped) is scaled by gz/gzref, where gz is an amplitude of the diffusion gradient applied in the slice direction in acquiring the diffusion-weighted echo-planar imaging data (i.e., the actual scan 274) and gzref is an amplitude of the diffusion gradient applied in the slice direction in acquiring the fourth reference scan 272. The reference 268, 270, and 272 have the same diffusion gradient duration, separation, and ramp time as the actual scan. Only the gradient amplitudes are different between the reference scans 268, 270, and 272 and the actual scan 274. The scaling enables the phase correction factor to be applied to any diffusion gradient direction and all diffusion gradient directions. As denoted by reference numeral 314, the phase correction factor (oECCPhase) is sum of the scaled phase differences (scaled gxPhase, scaled gyPhase, and scaled gzPhase) as represented by the following equation:

$$\text{oECCPhase} = gx\text{Phase} * gx/gx\text{ref} + gy\text{Phase} * gy/gy\text{ref} + gz\text{Phase} * gz/gz\text{ref}. \quad (1)$$

The phase correction factor is only a function of ky (i.e., independent of x and kx). As depicted (as denoted in reference numeral 314), the correction of the phase errors may be applied in k-space as indicated by the following equation:

$$\text{corretedKspace} = \text{uncorrectedKspace} * \exp(-1i * \text{oECCPhase}), \quad (2)$$

where i is an imaginary number. In certain embodiments, the correction of the phase errors may be applied in the hybrid x-ky space (e.g., derived from 1D FFT along the kx direction) since the phase correction factor is independent of x or kx. As noted above, correction of phase errors is independent of diffusion gradient direction.

The remaining portion of the process is the reconstruction of the diffusion-weighted echo-planar imaging data acquired in the actual scan 274 (as represented by reference numeral 316). As depicted, the diffusion-weighted echo-planar imaging data is subjected to row flip (represented by reference numeral 318). After application of row flip, phase correction is applied in the readout direction to the diffusion-weighted echo-planar imaging data (represented by reference numeral 320). After phase correction, ramp sampling interpolation is performed (represented by reference numeral 322). The sampled imaging data (e.g., k-space) is then subjected to correction of the phase errors (represented by reference numeral 324) utilizing the oECCPhase. As noted above, in certain embodiments, the correction of the phase errors may be applied in the hybrid x-ky space. Finally, the corrected k-space is subjected to 2D FFT and channel combination to generate the corrected diffusion-weighted echo-planar image. The diffusion-weighted echo-planar image may be free of ghosting and blurring errors or have minimal ghosting and/or blurring errors.

Figure 5:
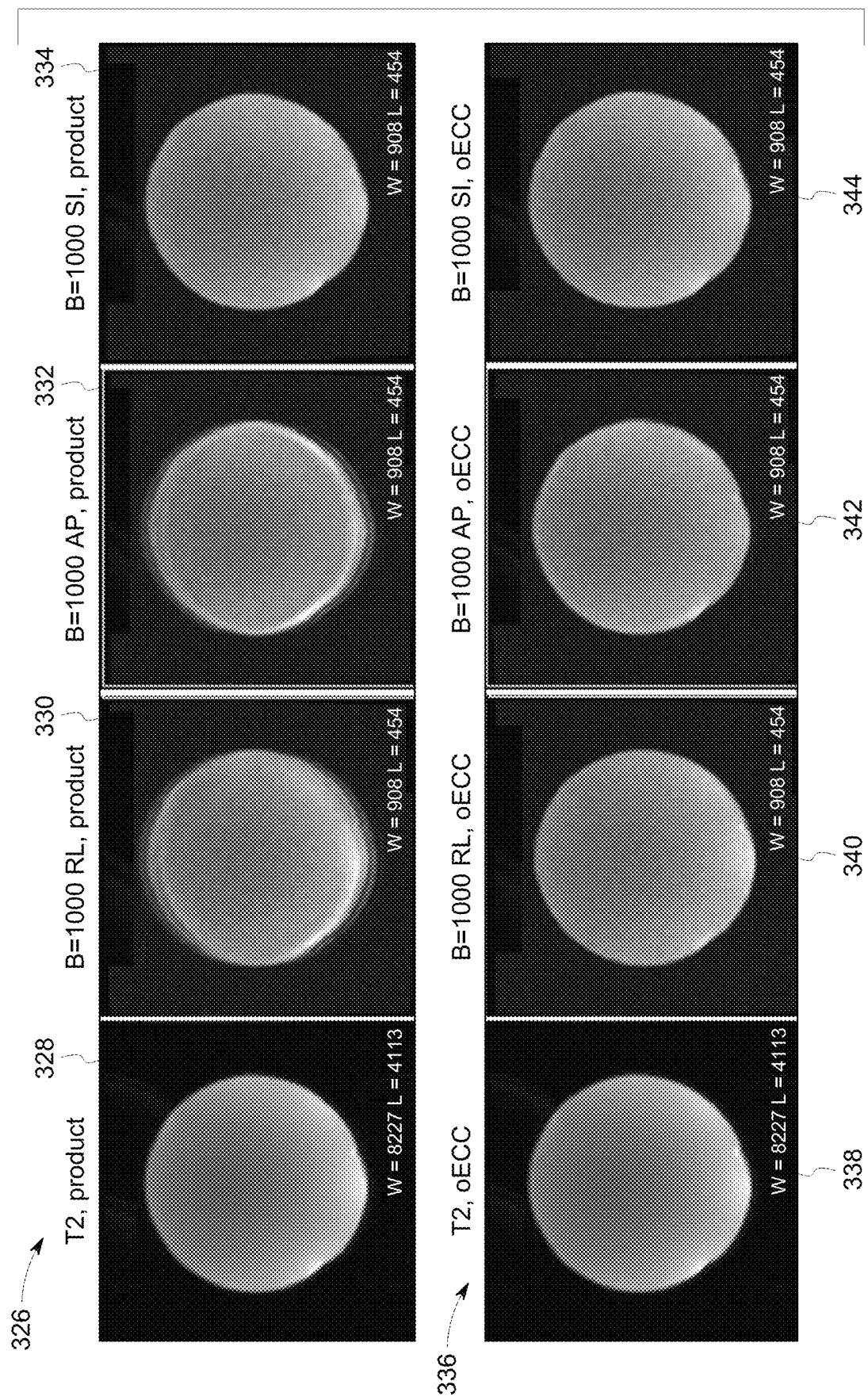
FIG. 5 depicts MRI images acquired of a phantom utilizing diffusion-weighted imaging comparing product compensation and phase error correction for oscillatory eddy current-induced phase errors.

FIG. 5 depicts MRI images acquired of a phantom utilizing diffusion-weighted imaging comparing product compensation and phase error correction for oscillatory eddy current-induced phase errors. The MRI images were acquired with a 1.5 Tesla (T) MRI system utilizing a head neck unit coil. The phantom is a TLT head phantom sphere. An oscillatory eddy current term, X-B$_0$, was dialed-in having an amplitude of 0.2 percent, a time-constant of 100 milliseconds, an oscillation frequency of 40 Hz, and an initial phase of 40 degrees. In addition, an oscillatory eddy current term, Y-B$_0$, was dialed-in having an amplitude of 0.2 percent, a time-constant of 100 milliseconds, an oscillation frequency of 40 Hz, and an initial phase of 40 degrees. An axial diffusion weighted imaging scan (a first scan) was conducted on the phantom with the following parameters: b=50/100/1000, direction=ALL, Time to Echo (TE)=fullTE, matrix=96×96, field of view (FOV)=24, thickness=10, slice=1. Another scan (a second scan) was conducted to obtain the reference scans which was a copy of the first scan but with the EPI yblips disabled (i.e., gyctrl=0). From the second scan, T2, b=50 RL (x-direction), b=50 AP (y-direction), and b=50 SI (z-direction) were used as the first, second, third, and four reference scans, respectively.

A top row 326 of MRI images includes a T2 image 328, an image 330 acquired at b=1000 in the x-direction (RL), an image 332 acquired at b=1000 in the y-direction (AP), and an image 334 acquired at B=1000 in the z-direction (SI). The top row 326 of MRI images were subjected to product compensation. Oscillatory eddy current-induced errors are present in the top row 326 of MRI images with these errors being more apparent in the images 330, 332. A bottom row 336 of MRI images includes a T2 image 338, an image 340 acquired at B=1000 in the x-direction (RL), an image 342 acquired at b=1000 in the y-direction (AP), and an image 344 acquired at b=1000 in the z-direction (SI). These images 338, 340, 342, 344 correspond to the images 328, 330, 332, 334. The bottom row 336 of MRI images were subjected to the phase error correction (oECC) as described in FIGS. 2 and 3. As depicted, the oscillatory eddy-current induced errors are not present or minimized in the bottom row 336 of images compared to the corresponding images in the top row 326.

Figure 6:
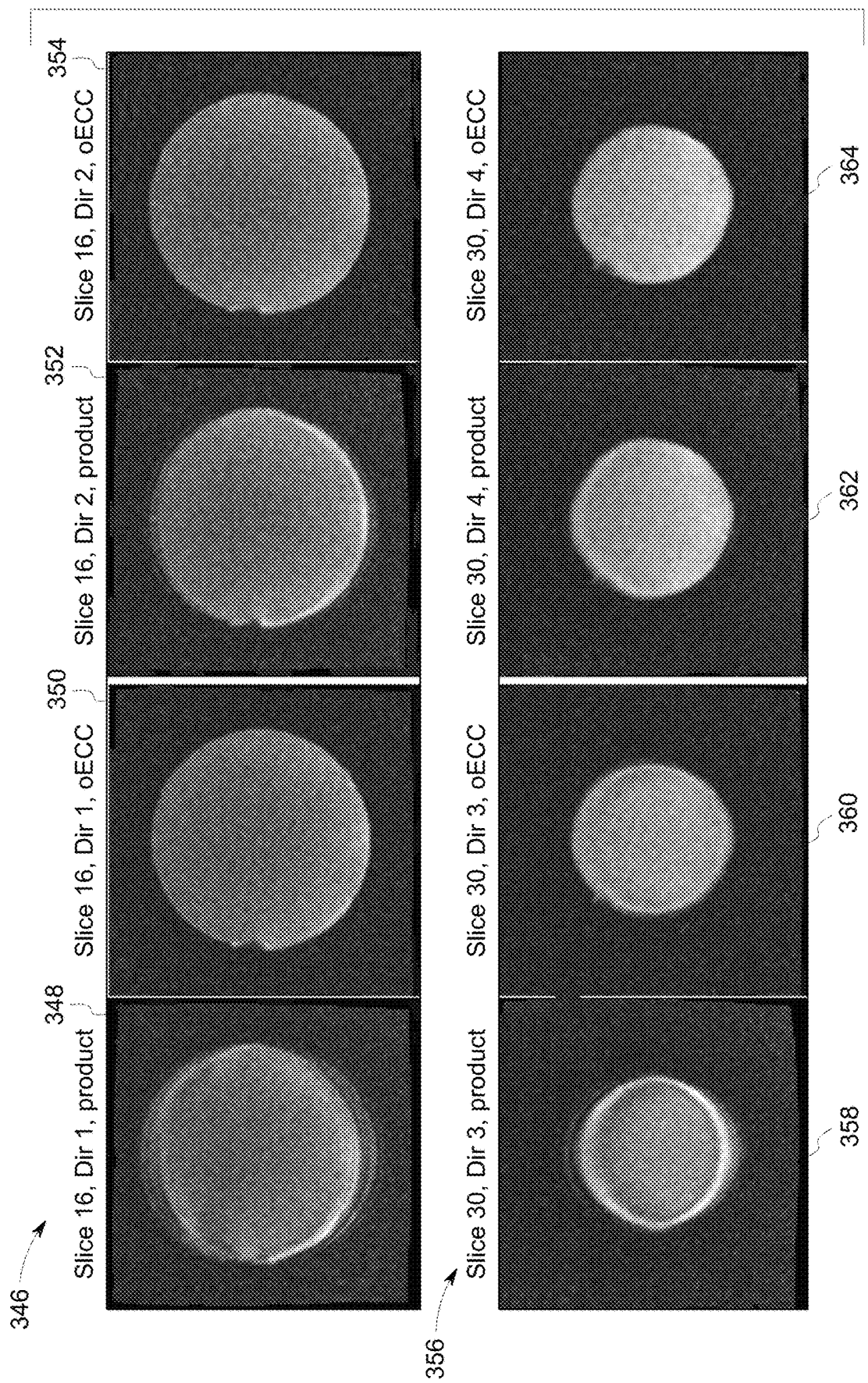
FIG. 6 depicts MRI images acquired of a phantom utilizing diffusion tensor imaging comparing product compensation and phase error correction for oscillatory eddy current-induced phase errors.

FIG. 6 depicts MRI images acquired of a phantom utilizing diffusion tensor imaging comparing product compensation and phase error correction for oscillatory eddy current-induced phase errors. The MRI images were acquired with a 1.5 Tesla (T) MRI system utilizing a head neck unit coil. The phantom is a TLT head phantom sphere. An oscillatory eddy current term, X-B$_0$, was dialed-in having an amplitude of 0.2 percent, a time-constant of 100 milliseconds, an oscillation frequency of 40 Hz, and an initial phase of 40 degrees. In addition, an oscillatory eddy current term, Y-B$_0$, was dialed-in having an amplitude of 0.2 percent, a time-constant of 100 milliseconds, an oscillation frequency of 40 Hz, and an initial phase of 40 degrees. An axial diffusion tensor imaging scan (a first scan) was conducted on the phantom with the following parameters: b=1000, direction=25, TE=fullTE, matrix=96×96, FOV=24, thickness=4, slice=32. Another scan (a second scan) was conducted to obtain the reference scans which was a copy of the first scan but with the EPI yblips disabled (i.e., gyctrl=0) and the following parameters b=50/100/1000 and direction=ALL. From the second scan, T2, b=50 RL (x-direction), b=50 AP (y-direction), and b=50 SI (z-direction) were used as the first, second, third, and four reference scans, respectively.

A top row 346 of MRI images includes images 348 and 350 acquired at b=1000 in a particular direction (Dir1) at a particular slice (slice 16). Image 348 was subject to product compensation while image 350 was subjected to the phase error correction (oECC) as described in FIGS. 2 and 3. As depicted, the oscillatory eddy-current induced errors are not present or minimized in the image 350 compared to the corresponding image 348. The top row 346 of MRI images also includes images 352 and 354 acquired at b=1000 in a different direction (Dir2) at the same slice (slice 16). Image 352 was subject to product compensation while image 354 was subjected to the phase error correction (oECC) as described in FIGS. 2 and 3. As depicted, the oscillatory eddy-current induced errors are not present or minimized in the image 354 compared to the corresponding image 352.

A bottom row 356 of MRI images includes images 358 and 360 acquired at b=1000 in a particular direction (Dir3) at a particular slice (slice 30). Image 358 was subject to product compensation while image 360 was subjected to the phase error correction (oECC) as described in FIGS. 2 and 3. As depicted, the oscillatory eddy-current induced errors are not present or minimized in the image 360 compared to the corresponding image 358. The bottom row 356 of MRI images also includes images 362 and 364 acquired at b=1000 in a different direction (Dir4) at the same slice (slice 30). Image 362 was subject to product compensation while image 364 was subjected to the phase error correction (oECC) as described in FIGS. 2 and 3. As depicted, the oscillatory eddy-current induced errors are not present or minimized in the image 364 compared to the corresponding image 362.

FIGS. 7-10 depict MRI images acquired of a patient (e.g., brain of the patient) utilizing diffusion tensor imaging comparing product compensation (in both the presence and absence of oscillatory eddy currents) and phase error correction in the presence of the oscillatory eddy currents. The MRI images were acquired with a 1.5 Tesla (T) MRI system utilizing a head neck unit coil. An axial diffusion tensor imaging scan (a first scan) was conducted on the patient (in the absence of oscillatory eddy currents) with the following parameters: b=1000, direction=15, TE-fullTE, matrix-96×96, FOV=24, thickness=4, slice=5. Another scan (a second scan) was conducted with same protocol as the first scan but with the oscillatory eddy currents added or dialed-in. An oscillatory eddy current term, $X-B_0$, was dialed-in having an amplitude of 0.2 percent, a time-constant of 100 milliseconds, an oscillation frequency of 40 Hz, and an initial phase of 40 degrees. In addition, an oscillatory eddy current term, $Y-B_0$, was dialed-in having an amplitude of 0.2 percent, a time-constant of 100 milliseconds, an oscillation frequency of 40 Hz, and an initial phase of 40 degrees. A further scan (a third scan) was conducted to obtain the reference scans which was a copy of the first scan but with the EPI yblips disabled (i.e., gyctrl=0) and the following parameters b=50/100/1000 and direction=ALL. From the third scan, T2, b=50 RL (x-direction), b=50 AP (y-direction), and b=50 SI (z-direction) were used as the first, second, third, and four reference scans, respectively.

Figure 7:
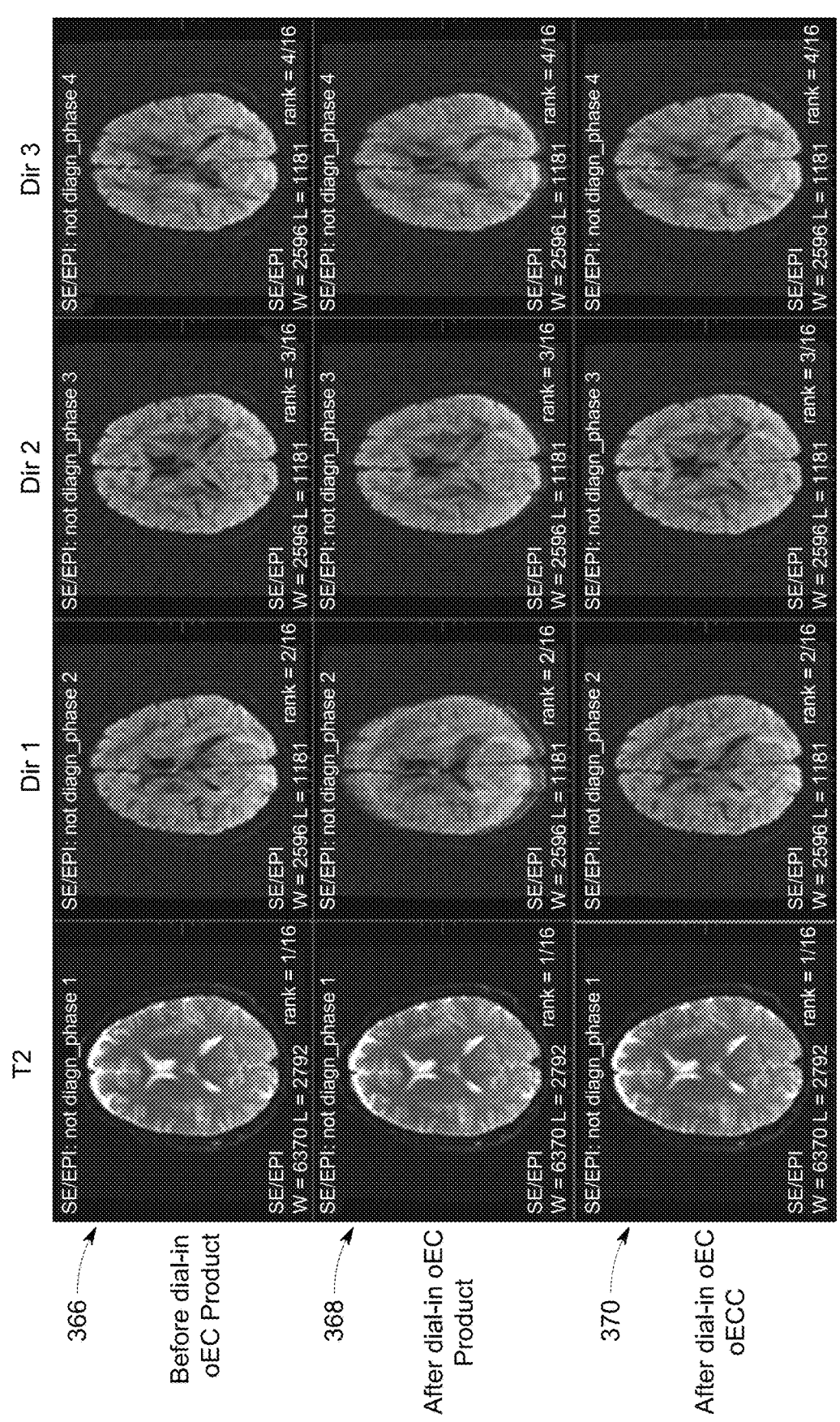
FIG. 7 depicts MRI images acquired of a patient utilizing diffusion tensor imaging comparing product compensation (in both the presence and absence of oscillatory eddy currents) and phase error correction in the presence of the oscillatory eddy currents (e.g., in T2-weighted images and along a first subset of directions or phases)

In FIG. 7, a top row 366 of MRI images were acquired (in the absence of oscillatory eddy currents) at b=1000 for T2 and a first subset of directions (e.g., Dir 1, Dir 2, and Dir 3). The top row 366 of MRI images were subjected to product compensation. A middle row 368 of MRI images were acquired (in the presence of oscillatory eddy currents) at b=1000 for T2 and the first subset of directions (e.g., Dir 1, Dir 2, and Dir 3). The middle row 368 of MRI images were subjected to product compensation. The bottom row 370 of MRI images were acquired (in the presence of oscillatory eddy currents) at b=1000 for T2 and the first subset of directions (e.g., Dir 1, Dir 2, and Dir 3). The bottom row 370 of MRI images were subjected to the phase error correction (oECC) as described in FIGS. 2 and 3.

Figure 8:
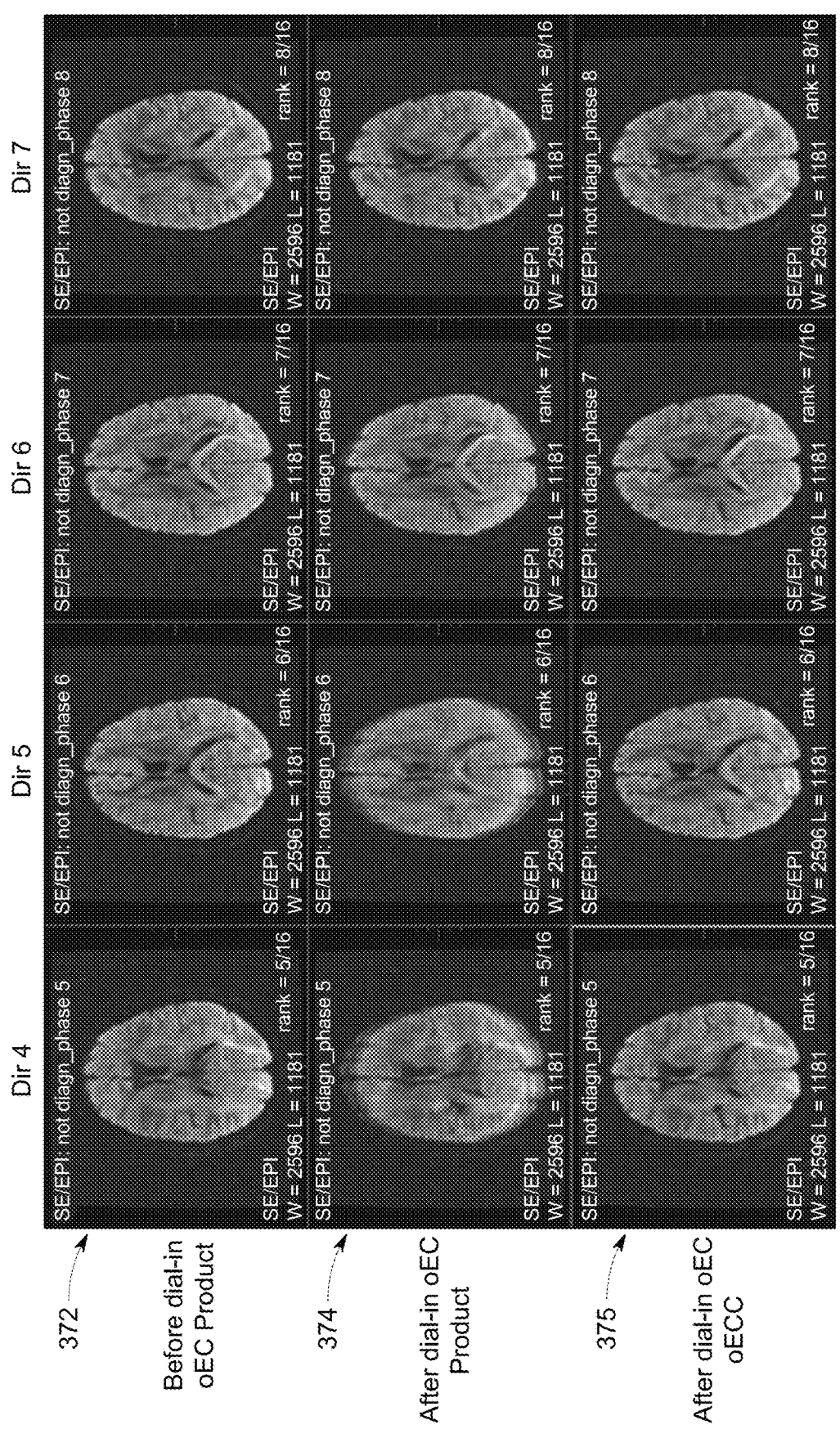
FIG. 8 depicts MRI images acquired of a patient utilizing diffusion tensor imaging comparing product compensation (in both the presence and absence of oscillatory eddy currents) and phase error correction in the presence of the oscillatory eddy currents (e.g., along a second subset of directions or phases)

In FIG. 8, a top row 372 of MRI images were acquired (in the absence of oscillatory eddy currents) at b=1000 for a second subset of directions (e.g., Dir 4, Dir 5, Dir 6, and Dir 7). The top row 372 of MRI images were subjected to product compensation. A middle row 374 of MRI images were acquired (in the presence of oscillatory eddy currents) at b=1000 for the second subset of directions (e.g., Dir 4, Dir 5, Dir 6, and Dir 7). The middle row 374 of MRI images were subjected to product compensation. The bottom row 375 of MRI images were acquired (in the presence of oscillatory eddy currents) at b=1000 for the second subset of directions (e.g., Dir 4, Dir 5, Dir 6, and Dir 7). The bottom row 375 of MRI images were subjected to the phase error correction (oECC) as described in FIGS. 2 and 3.

Figure 9:
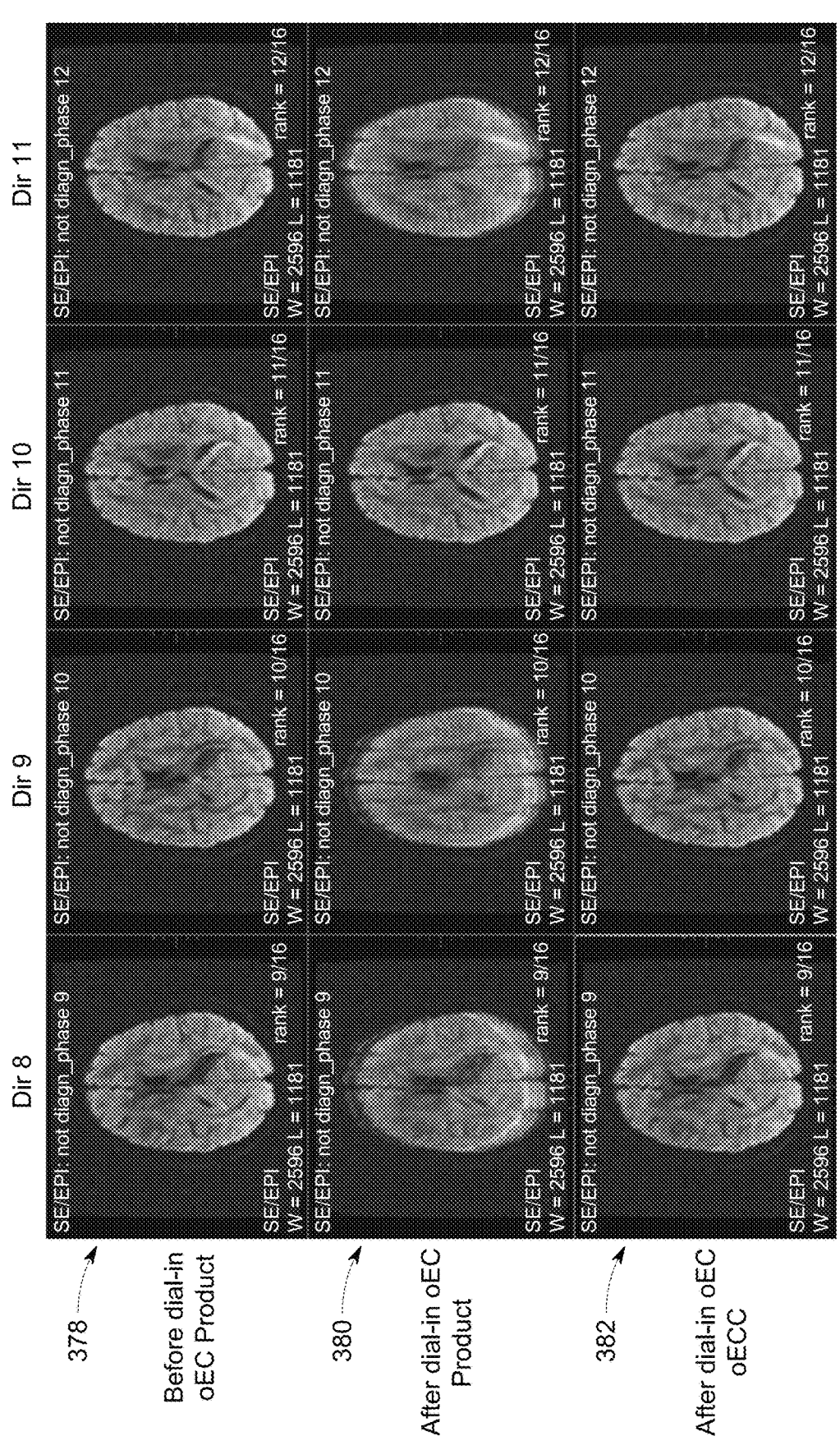
FIG. 9 depicts MRI images acquired of a patient utilizing diffusion tensor imaging comparing product compensation (in both the presence and absence of oscillatory eddy currents) and phase error correction in the presence of the oscillatory eddy currents (e.g., along a third subset of directions or phases)

In FIG. 9, a top row 378 of MRI images were acquired (in the absence of oscillatory eddy currents) at b=1000 for a third subset of directions (e.g., Dir 8, Dir 9, Dir 10, and Dir 11). The top row 378 of MRI images were subjected to product compensation. A middle row 380 of MRI images were acquired (in the presence of oscillatory eddy currents) at b=1000 for the third subset of directions (e.g., Dir 8, Dir 9, Dir 10, and Dir 11). The middle row 380 of MRI images were subjected to product compensation. The bottom row 382 of MRI images were acquired (in the presence of oscillatory eddy currents) at b=1000 for the third subset of directions (e.g., Dir 8, Dir 9, Dir 10, and Dir 11). The bottom row 382 of MRI images were subjected to the phase error correction (oECC) as described in FIGS. 2 and 3.

Figure 10:
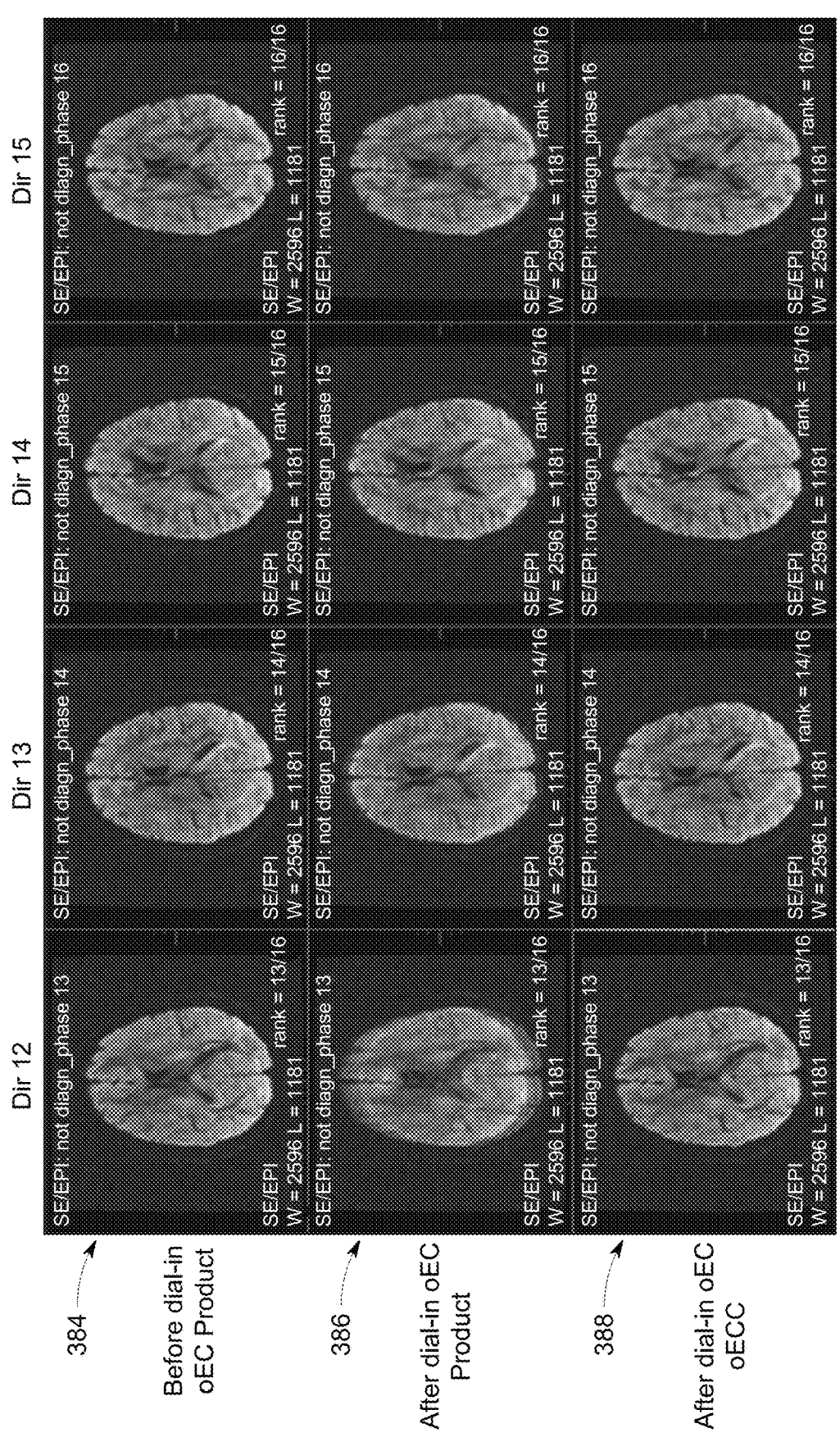
FIG. 10 depicts MRI images acquired of a patient utilizing diffusion tensor imaging comparing product compensation (in both the presence and absence of oscillatory eddy currents) and phase error correction in the presence of the oscillatory eddy currents (e.g., along a fourth subset of directions or phases).

In FIG. 10, a top row 384 of MRI images were acquired (in the absence of oscillatory eddy currents) at b=1000 for a fourth subset of directions (e.g., Dir 12, Dir 13, Dir 14, and Dir 15). The top row 384 of MRI images were subjected to product compensation. A middle row 386 of MRI images were acquired (in the presence of oscillatory eddy currents) at b=1000 for the fourth subset of directions (e.g., Dir 12, Dir 13, Dir 14, and Dir 15). The middle row 386 of MRI images were subjected to product compensation. The bottom row 388 of MRI images were acquired (in the presence of oscillatory eddy currents) at b=1000 for the fourth subset of directions (e.g., Dir 12, Dir 13, Dir 14, and Dir 15). The bottom row 388 of MRI images were subjected to the phase error correction (oECC) as described in FIGS. 2 and 3.

As depicted in FIGS. 7-10, the oscillatory eddy-current induced errors are not present or minimized in the bottom rows 370, 375, 382, and 388 of MRI images compared to the corresponding images in the middle rows 368, 374, 380, and 386 of MRI images. In addition, as depicted in FIGS. 7-10, the phase error correction (oECC) as described in FIGS. 2 and 3 can be utilized in any and all diffusion gradients.

Technical effects of the disclosed subject matter include providing techniques for correcting diffusion-weighted echo-planar imaging data. In particular, the disclosed embodiments are configured to correct $B_0$ shift caused by oscillatory eddy currents (both exponential and oscillatory eddy current, but especially oscillatory eddy currents). In particular, phase errors due to oscillatory eddy currents causing time-varying $B_0$ shift are corrected. The disclosed embodiments still further include correcting the phase errors due to the oscillatory eddy currents in the diffusion-weighted echo-planar imaging data independent of diffusion gradient direction. Thus, the phase error correction can be applied in any and all diffusion directions. Correction of $B_0$ shift (i.e., phase errors) due to the oscillatory eddy currents enables the generation of a diffusion-weighted echo-planar image from the corrected diffusion-weighted echo planar imaging data free of ghosting and blurring errors or with minimal ghosting and blurring errors.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for correcting diffusion-weighted echo-planar imaging data, comprising:
    obtaining, via a processor accessing and executing processor-executable code stored on a non-transitory computer-readable medium, a first reference scan with no diffusion gradients applied, a second reference scan with a diffusion gradient applied only along a frequency direction, a third reference scan with the diffusion gradient applied only along a phase direction, and a fourth reference scan with the diffusion gradient applied only along a slice direction acquired utilizing a magnetic resonance imaging (MRI) scanner, wherein the first, second, third, and fourth reference scans lack phase encoding;
    obtaining, via the processor accessing and executing the processor-executable code stored on the non-transitory computer-readable medium, diffusion-weighted echo-planar imaging data acquired utilizing the MRI scanner, wherein the diffusion-weighted echo-planar imaging data comprises phase errors due to oscillatory eddy currents causing time-varying Bo shift, wherein the first reference scan, the second reference scan, the third reference scan, the fourth reference scan, and the diffusion-weighted echo-planar imaging data are acquired of a subject during an imaging session;
    generating, via the processor accessing and executing the processor-executable code stored on the non-transitory computer-readable medium, a phase correction factor based on the first, second, third, and fourth reference scans;
    correcting, via the processor accessing and executing the processor-executable code stored on the non-transitory computer-readable medium, the phase errors due to the oscillatory eddy currents in the diffusion-weighted echo-planar imaging data independent of diffusion gradient direction utilizing the phase correction factor to generate corrected diffusion-weighted echo-planar imaging data;
    generating, via the processor accessing and executing the processor-executable code stored on the non-transitory computer-readable medium, a diffusion-weighted echo-planar image from the corrected diffusion-weighted echo planar imaging data free of ghosting and blurring errors; and
    storing, via the processor accessing and executing the processor-executable code stored on the non-transitory computer-readable medium, the diffusion-weighted echo-planer image in a non-transitory memory or causing, via the processor accessing and executing the processor-executable code stored on the non-transitory computer-readable medium, display of the diffusion-weighted echo-planer image.

2. A system for correcting diffusion-weighted echo-planar imaging data, comprising:
    a non-transitory memory encoding processor-executable routines; and
    a processor configured to access the non-transitory memory and to execute the processor-executable routines, wherein the routines, when executed by the processor, cause the processor to:
        obtain a first reference scan with no diffusion gradients applied, a second reference scan with a diffusion gradient applied only along a frequency direction, a third reference scan with the diffusion gradient applied only along a phase direction, and a fourth reference scan with the diffusion gradient applied only along a slice direction acquired utilizing a magnetic resonance imaging (MRI) scanner, wherein the first, second, third, and fourth reference scans lack phase encoding;
        obtain diffusion-weighted echo-planar imaging data acquired utilizing the MRI scanner, wherein the diffusion-weighted echo-planar imaging data comprises phase errors due to oscillatory eddy currents causing time-varying Bo shift, wherein the first reference scan, the second reference scan, the third reference scan, the fourth reference scan, and the diffusion-weighted echo-planar imaging data are acquired of a subject during an imaging session;
        generate a phase correction factor based on the first, second, third, and fourth reference scans;
        correct the phase errors due to the oscillatory eddy currents in the diffusion-weighted echo-planar imaging data independent of diffusion gradient direction utilizing the phase correction factor to generate corrected diffusion-weighted echo-planar imaging data;
        generate a diffusion-weighted echo-planar image from the corrected diffusion-weighted echo planar imaging data free of ghosting and blurring errors; and
        store the diffusion-weighted echo-planer image in the non-transitory memory or cause display of the diffusion-weighted echo-planer image.

3. A non-transitory computer-readable medium, the computer-readable medium comprising processor-executable code that when executed by a processor, causes the processor to:
    obtain a first reference scan with no diffusion gradients applied, a second reference scan with a diffusion gradient applied only along a frequency direction, a third reference scan with the diffusion gradient applied only along a phase direction, and a fourth reference scan with the diffusion gradient applied only along a slice direction acquired utilizing a magnetic resonance imaging (MRI) scanner, wherein the first, second, third, and fourth reference scans lack phase encoding;
    obtain diffusion-weighted echo-planar imaging data acquired utilizing the MRI scanner, wherein the diffusion-weighted echo-planar imaging data comprises phase errors due to oscillatory eddy currents causing time-varying Bo shift, wherein the first reference scan, the second reference scan, the third reference scan, the fourth reference scan, and the diffusion-weighted echo-planar imaging data are acquired of a subject during an imaging session;

generate a phase correction factor based on the first, second, third, and fourth reference scans;

correct the phase errors due to the oscillatory eddy currents in the diffusion-weighted echo-planar imaging data independent of diffusion gradient direction utilizing the phase correction factor to generate corrected diffusion-weighted echo-planar imaging data;

generate a diffusion-weighted echo-planar image from the corrected diffusion-weighted echo planar imaging data free of ghosting and blurring errors; and store the diffusion-weighted echo-planer image in a non-transitory memory or cause display of the diffusion-weighted echo-planer image.

4. The computer-implemented method of claim 1, wherein correcting the phase errors comprises applying the phase correction factor in k-space data or hybrid x-ky space data of the diffusion-weighted echo-planar imaging data.

5. The computer-implemented method of claim 1, wherein the first, second, third, and fourth reference scans are acquired and a respective phase correction factor is generated for each respective slice where the diffusion-weighted echo-planar imaging data is acquired, and the phase errors are corrected with the respective phase correction factor for the diffusion-weighted echo-planer imaging data acquired at the respective slice.

6. The computer-implemented method of claim 1, wherein the first, second, third, and fourth reference scans are acquired and a phase correction factor is generated for a first slice where the diffusion-weighted echo-planar imaging data is acquired, and the phase errors are corrected with the phase correction factor for the diffusion-weighted echo-planer imaging data acquired at the first slice and other slices.

7. The computer-implemented method of claim 1, wherein generating the phase correction factor comprises calculating a first phase difference along the frequency direction, a second phase difference along the phase direction, and a third phase difference along the slice direction, and utilizing the first, second, and third phase differences in generating the phase correction factor.

8. The computer-implemented method of claim 1, wherein respective amplitudes of the diffusion gradient applied in the frequency direction when acquiring the second reference scan, the diffusion gradient applied in the phase direction when acquiring the third reference scan, and the diffusion gradient applied in the slice direction when acquiring the fourth reference scan are selected to keep calculated b-values between 50 and 100 seconds/millimeter$^2$.

9. The system of claim 2, wherein correcting the phase errors comprises applying the phase correction factor in k-space data or hybrid x-ky space data of the diffusion-weighted echo-planar imaging data.

10. The system of claim 2, wherein generating the phase correction factor comprises calculating a first phase difference along the frequency direction, a second phase difference along the phase direction, and a third phase difference along the slice direction, and utilizing the first, second, and third phase differences in generating the phase correction factor.

11. The non-transitory computer-readable medium of claim 3, wherein correcting the phase errors comprises applying the phase correction factor in k-space data or hybrid x-ky space data of the diffusion-weighted echo-planar imaging data.

12. The non-transitory computer-readable medium of claim 3, wherein generating the phase correction factor comprises calculating a first phase difference along the frequency direction, a second phase difference along the phase direction, and a third phase difference along the slice direction, and utilizing the first, second, and third phase differences in generating the phase correction factor, and wherein generating the phase correction factor comprises scaling the first phase by a quotient of a first amplitude of the diffusion gradient applied in the frequency direction when acquiring the diffusion-weighted echo-planar imaging data divided by a second amplitude of the diffusion gradient applied in the frequency direction in acquiring the second reference scan.

13. The computer-implemented method of claim 7, wherein the first, second, and third phase differences are respectively acquired at a respective central readout point for each ky line.

14. The computer-implemented method of claim 7, wherein the first, second, and third phase differences are respectively acquired at an average of multiple readout points for each ky line.

15. The computer-implemented method of claim 7, wherein the first phase difference is an oscillatory eddy current-induced phase change due to the diffusion gradient applied along the frequency direction, and the phase correction factor is only a function of ky.

16. The computer-implemented method of claim 7, wherein generating the phase correction factor comprises scaling the first phase by a quotient of a first amplitude of the diffusion gradient applied in the frequency direction in acquiring the diffusion-weighted echo-planar imaging data divided by a second amplitude of the diffusion gradient applied in the frequency direction in acquiring the second reference scan.

17. The system of claim 10, wherein generating the phase correction factor comprises scaling the first phase by a quotient of a first amplitude of the diffusion gradient applied in the frequency direction when acquiring the diffusion-weighted echo-planar imaging data divided by a second amplitude of the diffusion gradient applied in the frequency direction in acquiring the second reference scan.

* * * * *